United States Patent [19]
Val

[11] Patent Number: 5,237,204
[45] Date of Patent: * Aug. 17, 1993

[54] ELECTRIC POTENTIAL DISTRIBUTION DEVICE AND AN ELECTRONIC COMPONENT CASE INCORPORATING SUCH A DEVICE

[75] Inventor: Christian Val, St. Remy Les Chevreuses, France

[73] Assignee: Compagnie D'Informatique Militaire Spatiale et Aeronautique, Paris, France

[*] Notice: The portion of the term of this patent subsequent to Mar. 31, 2004 has been disclaimed.

[21] Appl. No.: 752,902

[22] Filed: Aug. 26, 1991

Related U.S. Application Data

[63] Continuation of Ser. No. 361,694, Jun. 2, 1989, abandoned, which is a continuation of Ser. No. 131,238, Dec. 7, 1987, abandoned, which is a continuation of Ser. No. 735,731, May 20, 1985, abandoned.

Foreign Application Priority Data

May 25, 1984 [FR] France ................................ 8408247

[51] Int. Cl.⁵ .................... H01L 23/12; H01L 23/14; H01L 23/02
[52] U.S. Cl. ..................... 257/698; 257/704; 257/723; 257/724; 257/691
[58] Field of Search ............. 357/74, 80, 75, 72; 174/52 FP, 52 S, 52.4; 361/414, 402; 257/691, 698, 704, 723, 724, 700

[56] References Cited

U.S. PATENT DOCUMENTS

| | | | |
|---|---|---|---|
| 4,249,196 | 2/1981 | Durney et al. | 357/74 |
| 4,338,621 | 7/1982 | Braun | 174/52 FP |
| 4,539,622 | 9/1985 | Akasaki | 174/52 FP |
| 4,541,003 | 9/1985 | Otsuka et al. | 357/84 |
| 4,608,592 | 8/1986 | Miyamoto | 357/74 |
| 4,654,694 | 3/1987 | Val | 357/75 |
| 4,903,120 | 2/1990 | Beene et al. | 357/74 |

FOREIGN PATENT DOCUMENTS

| | | | |
|---|---|---|---|
| 0032661 | 2/1982 | Japan | 357/74 |
| 0128754 | 8/1983 | Japan | 357/75 |
| 0040061 | 1/1984 | Japan | 357/74 |

OTHER PUBLICATIONS

"Improved Electrical Performance Required for Future MOS Packaging"—Schaper et al.,—IEEE Trans. on Components.
Hybrids and Manufacturing Technology, vol. (HMT-6 (1983), Sep., No. 3, NY USA) pp. 283-289.
"Dual-in-Line Package Socket Piggy back Structure", McAtee—IBM Technical Disclosure, vol. 16, No. 4, Sep. 1973, p. 1315.

Primary Examiner—Rolf Hille
Assistant Examiner—Sheila V. Clark
Attorney, Agent, or Firm—Roland Plottel

[57] ABSTRACT

The invention provides a device for distributing electric potentials for supplying a component with electric power, capable of being incorporated in the case in which the component is encapsulated.

This device is in the form of a plate comprising conducting planes connected to external power supply potentials. This plate either forms the cover of the case or is placed inside the case above said component. Each of the conducting planes of the device is connected, outside the case, to the power supply potential and, inside the case, at multiple points to the component so as to distribute these potentials to the appropriate inputs-/outputs thereof, thus reducing the number of inputs-/outputs of the case.

17 Claims, 4 Drawing Sheets

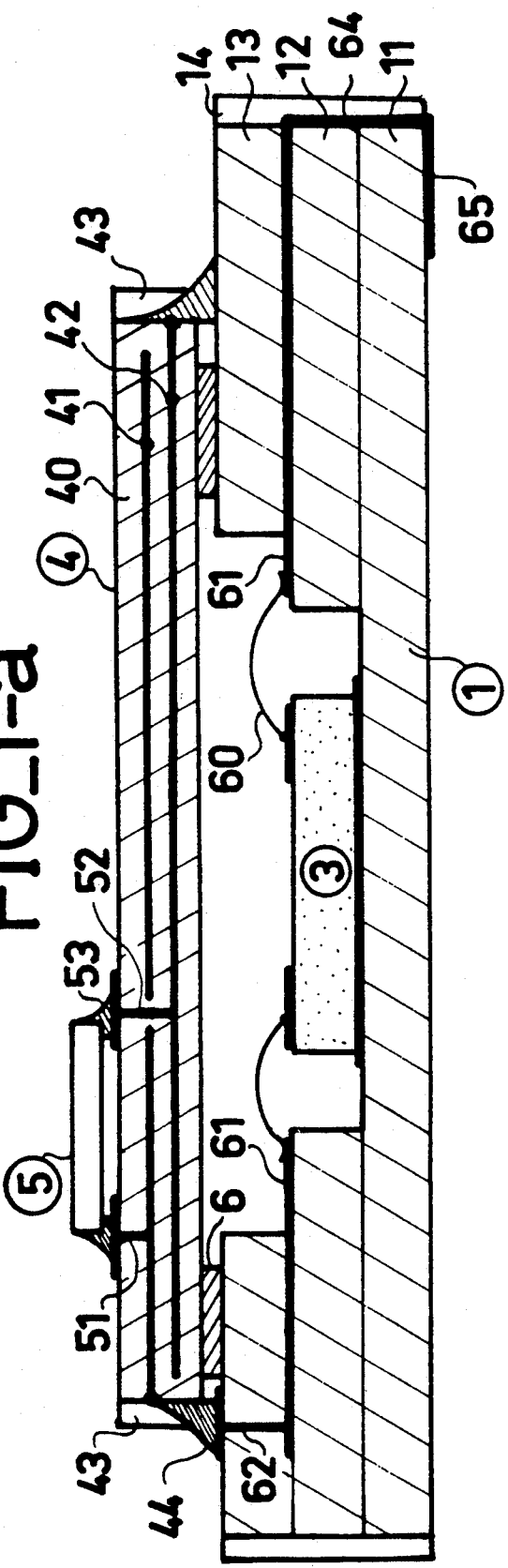
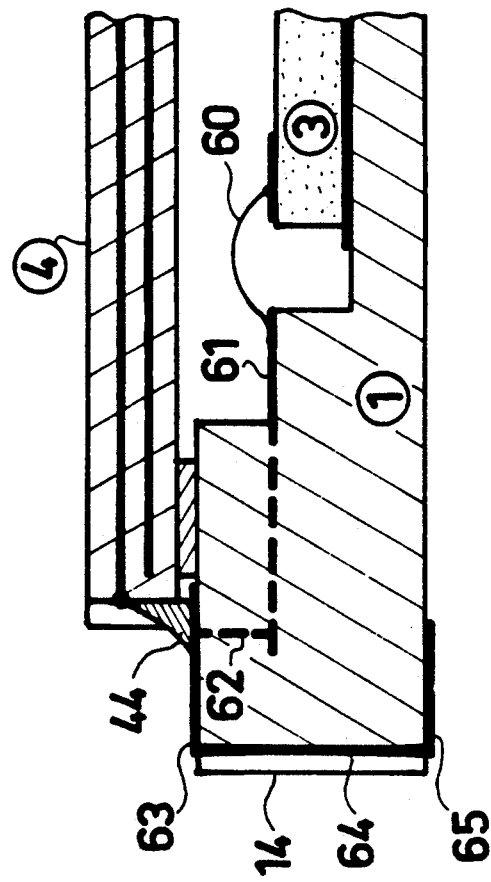

FIG_2
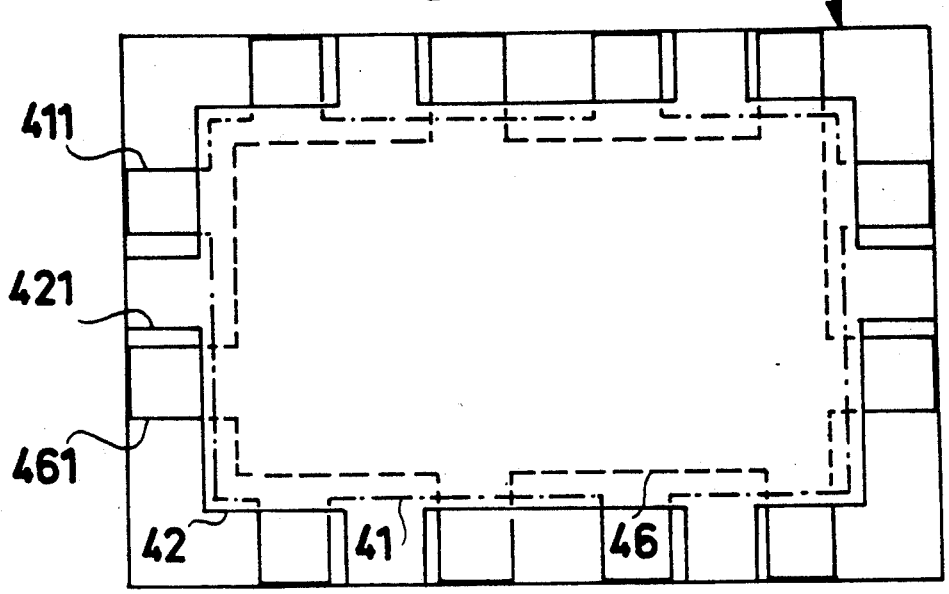
FIG_3-a
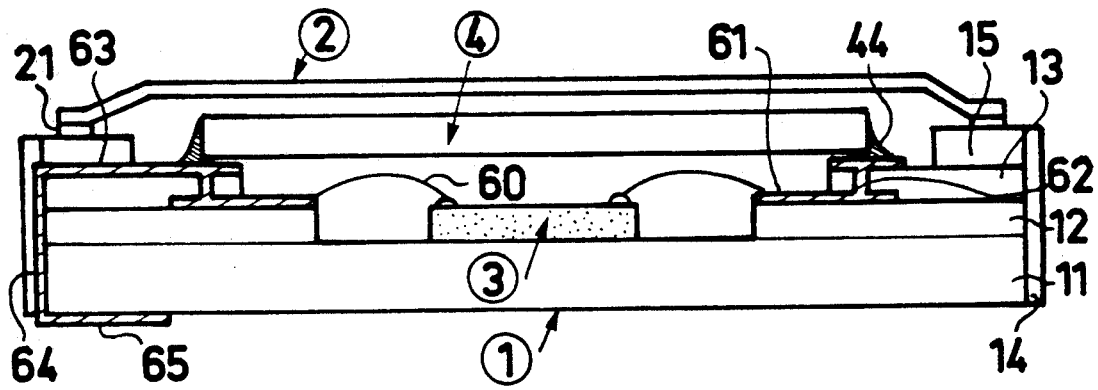
FIG_3-b
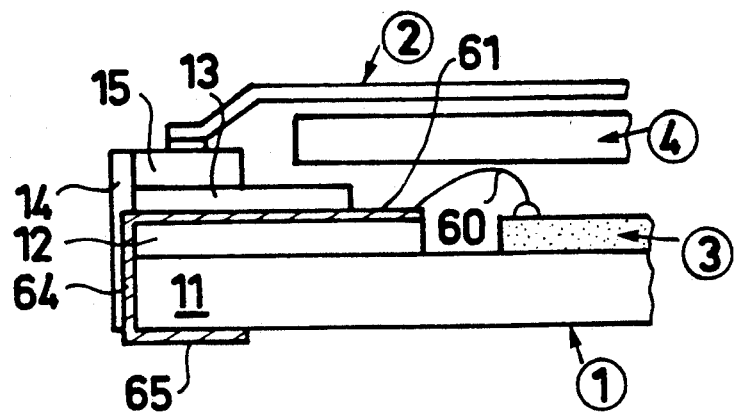

FIG_4-a
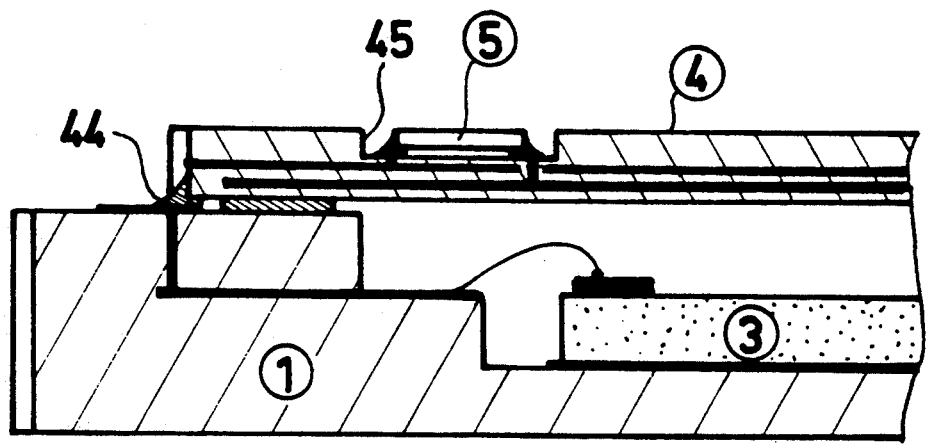
FIG_4-b
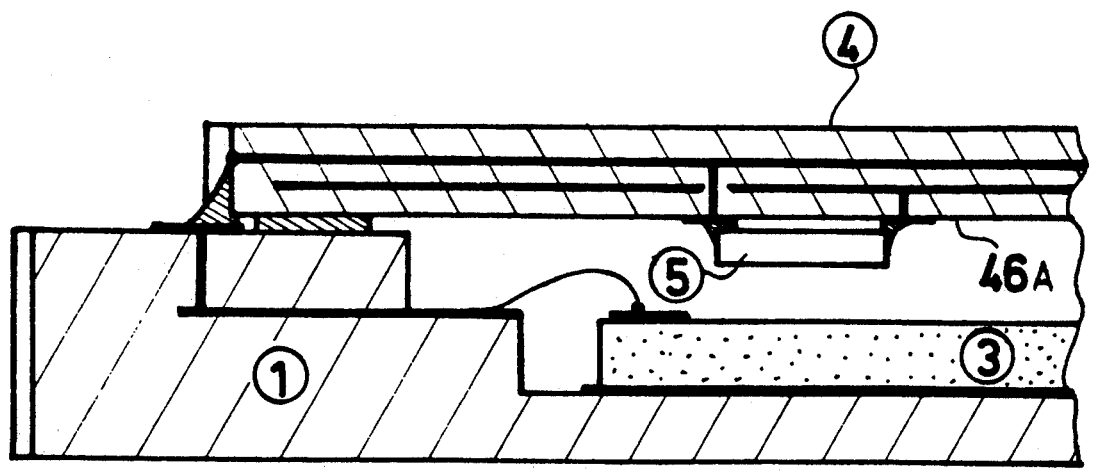

FIG_5-a
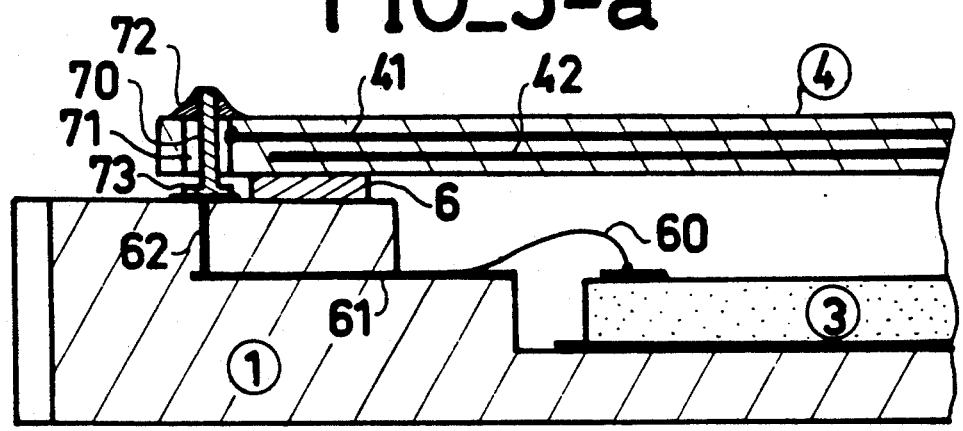
FIG_5-b
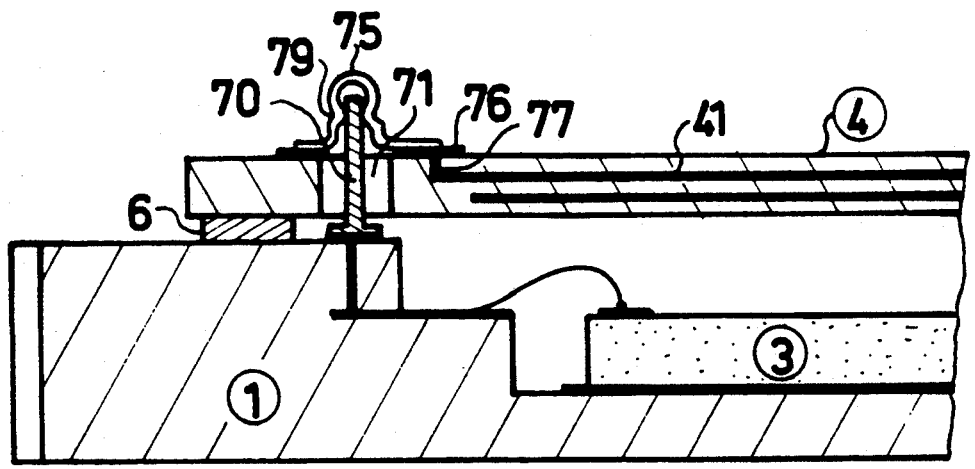
FIG_5-c
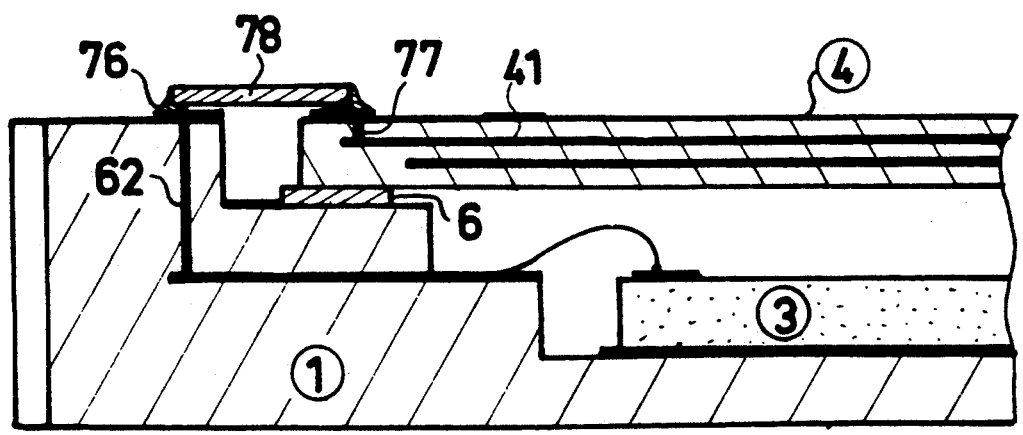

ELECTRIC POTENTIAL DISTRIBUTION DEVICE AND AN ELECTRONIC COMPONENT CASE INCORPORATING SUCH A DEVICE

This is a continuation of application Ser. No. 07/361,694, filed on Jun. 2, 1989, which was abandoned upon the filing hereof which is a continuation of Ser. No. 07/131,238 filed Dec. 7, 1987 which is now abandoned, which is a continuation of Ser. No. 06/735,731 filed May 20, 1985 which is now abandoned.

BACKGROUND OF THE INVENTION

The present invention relates to electronic component cases and relates more particularly still to a device for distributing the electric potentials supplying the component, which device is capable of being incorporated in the case.

As is known, in much modern equipment attempts are made to miniaturize the electronics. This is achieved more especially by increasing the degree of integration of the integrated circuits, which results in practice both in an increase in the complexity and in the number of functions of each integrated circuit and in a reduction of the number of components. However, the increase in complexity of a component leads to an increase in the number of its inputs and outputs and correspondingly lays down a minimum size for the case enclosing the component, whether the cases have connecting leads (or pins) or not (case not having connecting lugs are known under the ne of "chip carrier"), which correspondingly reduces the possibilities of miniaturization.

SUMMARY OF THE INVENTION

An object of the present invention is to provide a device for distributing the electric supply potentials required for a component (for example one or more potentials of predefined value and a reference potential, or ground), this device being intended to be incorporated in the case enclosing the component. The distribution device receives the supply potentials from outside the case and it is connected at multiple points to the component so as to distribute the potentials to appropriate inputs/outputs of the component, thus reducing the number of inputs/outputs of the case itself and consequently its size, for a given component.

More precisely, the electric potential distribution device intended for an electronic component carried by a base, comprises at least one conducting plane, connected electrically by at least one point to the external electric potential and by a plurality of points to the component.

BRIEF DESCRIPTION OF THE DRAWINGS

Other objects, features and results of the invention will be clear from the following description, illustrated by the following accompanying drawings which show:

FIG. 1a and b, a first embodiment of the device of the invention in which this latter forms the cover of a case;

FIG. 2, one arrangement of the conducting planes used in the device of the invention;

FIGS. 5a and b, a second embodiment of the device of the invention in which this latter is placed inside a case;

FIGS. 4a and b, variants of inserting in the device of the invention one or more discrete capacitors;

FIGS. 5a, b and c, variants of the connection of the device to the rest of the case.

In the different Figures, on the one hand the same reference refer to the same elements and on the other hand the real scale of the different elements is not respected for the sake of clarity of the drawings.

DESCRIPTION OF THE PREFERRED EMBODIMENTS

In FIG. 1a is shown a case for encapsulating a component 3, formed for example by an integrated electronic circuit formed on a chip of a semiconductor material, for example silicon. It should be noted that in the present description by "component" is meant any passive or active, discrete or integrated component as well as any electronic circuit (hybrid circuit for example) capable of being encased.

The case shown in FIG. 1a is formed mainly from a base 1, carrying the component 3, and a cover formed by the distribution device 4 of the invention. By way of example, a case of the "chip carrier" type has been shown.

Base 1 is made from a material which must generally be rigid, preferably electrically insulating and having certain thermal qualities such as good heat conduction and an expansion coefficient as close as possible to that of the component 3. It is for example made from plastic, glass, ceramics etc. ...; in the case where component 3 is made from silicon, the base may be advantageously made from alumina. The base is formed, in the example shown from three separate parts referenced respectively 11, 12 and 13. The first part 11 is in the form of a small plate and supports the component 3. The other two parts are each formed from a ring, the rings being concentric and disposed one above the other, about component 3, with an increasing inner diameter, so as to allow the electric connections between the component, the distributor 4 and the outside. Component 3 is therefore fixed on the upper face of the plate 11, for example by brazing to a metallization shown with a thick line.

The connections are formed in the following way. The connection points of component 3 are each connected by conductors leads such as lead 60 to conducting tracks 61 disposed on the upper part of the ring 12 of base 1. These tracks 61 are connected to the rest of the device in three different ways, depending on the function which they fulfill.

In a first way, illustrated by way of example in the left hand portion of FIG. 1a, track 61 ends at a conducting well 62, passing through ring 13 from one side to the other and forming the electric connection between track 61 and a connection stud 44 of the distributing device 4. This first way corresponds to connections between component 3 and the distribution device 4, which connections do not therefore extend outside the case.

In a second way, illustrated by way of example in the right hand portion of FIG. 1a, track 61 is not connected to the distributing device 4 but ends directly at a half-hole 14, substantially in the form of a half-cylinder formed in the thickness of base 1 at is periphery in which a track 64 connects track 61 to a connection stud 65 intended to connect the case to the outside. This second type of connection is therefore used for transmitting the information carrying signals (as opposed to the supply voltages) from the outside to component 3 and vice versa.

The third way is illustrated in FIG. 1b where the fraction of the case concerning the connections is shown. In this case, it is the connection 44 of the distributing device 4 which is connected to the connection stud 65 of the case, through a track 64 passing through a half-hold 14 and a track 63 disposed on the upper part of the disk 13 between well 62 and a half-hole 14. This third way corresponds to the connection of the distributing device 4 to an external supply potential. In a variant shown in FIG. 1b with a broken line, at the level of a connection of device 4 with the outside (third way) a connection of the first type may be superimposed between device 4 and the component 3.

The tracks and connections 61 to 65 are for example formed with a refractory metal base (tungsten for example).

By way of example, for a component with about 250 input/outputs, broken down into 190 inputs/outputs assigned to information signals and 60 inputs/outputs assigned to two supply voltages and a ground, we have: 54 inputs/outputs of the first type, which do not extend outside the case; 190 signal inputs/outputs of the second type and six inputs/outputs of the third type, providing both the power supply for device 4 and, directly, that of the component 3. It is thus clear from this numerical example that from 250 connection studs of a component, a case is obtained having only 196 connections.

The distribution device 4 of the invention is formed by one or more conducting planes, depending on the number of supply potentials to be distributed to the component 3. In the example shown in the FIGS. 1a and 1b, two planes referenced 41 and 42, separated and surrounded by an insulator 40, are disposed so as to form a rigid plate, used for forming the cover of the case. In the embodiment shown, the periphery of plate 4 has half-holes 43 similar to the half-holes 14 of the base. The materials used for forming the conducting planes 41 or 42 are chosen so that they have high electric conductivity. In a first method of manufacture, refractory conducting materials such as tungsten, molymanganese or molybdenum-tungsten are disposed by silk screen printing on alumina layers and the assembly is baked. In another operating method, a baked alumina substrate is used on which are deposited by silk screen printing metal planes such as silver-palladium, copper, gold or gold-platinum, which are each covered by a glass based electric insulator (glass containing lead oxide) and crystalline charges such as alumina. In a third process, a stack of the multi layer printed circuit type is used, the insulating parts being made from epoxy glass for example of having a polyimide base, and the conducting parts being made from copper.

In FIG. 2 has been shown one possible lay out of the different conducting planes of FIG 1a.

In this FIG. 2, it can be seen that the conducting plane 42, connected for example to ground, has dimensions slightly less than those of device 4 and is extended by tongues 421 towards the periphery of the device. Similarly, plane 41, connected for example to a supply potential, is provided with tongues 411 placed as close as possible to the ground tongues 421 and preferably in equal number. Finally, pane 46 is connected to another supply potential. It also comprises tongues referenced 461 and in number equal to the preceding ones, so as to form groups of three tongues 411, 421, 461, in the numbers required for distributing the potentials of device 4 to component 3.

Thus a structure is obtained in which the ground and two supply potentials are distributed over the periphery of device 4 for reducing the inductance of the inputs-outputs since the ground connection is placed between the power supply connections, as close as possible to each other.

So as to form a sealed cover for the case, device 4 is fixed (FIG. 1a) by means of a sealing ring 6 to the upper part of base 1. In the embodiment shown in FIG. 1a, the connections such as 44 are situated outside the sealing ring 6.

Furthermore, in a variant embodiment, the distribution device 4 is provided with one or more discrete decoupling capacitors 5 placed in FIG. 1a on the upper (outer) face of device 4. The capacitors are connected between two conducting planes one of which is connected to the ground by means of capacitors wells 51 and 52, passing through the insulator 40 and, if required, in an insulated manner through one or more conducting planes such as 41 or 42, and connections studs 53.

FIGS. 3a and b show a second embodiment of the invention in which the distribution device is situated inside the case.

In these Figures we find again component 3 carried by base 1 but, by way of example, this latter is formed by three rings and not two deposited on plate 11, the third ring being referenced 15. The distribution device 4 is disposed on the upper face of the second ring 13 and is connected as shown in FIGS. 3a and 3b, similar to FIGS. 1a and 1b. The third ring 15 is disposed at the periphery of device 4 and receives a cover 2 of the case, fixed to base 1 by means of a seal 21. This cover may be made from metal or an insulating material, formed form the same material as base 1 or not.

Device 4 has not been shown in detail in FIGS. 3a and b but is formed as is described above and may also carry discrete capacitors such as 5.

In a variant, cover 2 may also carry such capacitors.

The embodiment shown in FIGS. 3a and b is a little more complex than that shown in FIGS. 1a and b but it allows the connections for device 4 and sealing of the cover to the base of the case to be provided separately, which forms an advantage in certain practical constructions.

FIG. 4a shows a variant in the arrangement of cluster 5 on the distribution device 4 of the preceding Figures.

In this Figure, by way of example a fraction of base 1, of component 3 and of the distribution device 4 has been shown, disposed with respect to each other as in FIG. 1a. In this variant, a recess 45 has been formed in the outer face of the distribution device 4, which recess has dimensions such that capacitor 5 may be buried therein without projection above this surface.

FIG. 4b shows another variant for positioning the decoupling capacitor 5.

In this variant, the capacitor is placed on the lower face 46A of device 4 in the same way as it was placed on the upper face of the same device in FIG. 1a.

In another variant, not shown, the lower face 46A of device 4 may have a recess such as 45 (FIG. 4a) for allowing capacitor 5 to be positioned without it extending beyond the level of the surface.

FIGS. 5a, b and c show different variants of the connection of the distribution device 4 to the rest of the case.

In FIG. 5a, the same configuration has been shown by way of example as the one shown in FIG. 1a (left hand portion), namely a three stage base 1, carrying a component 3 and the distribution device 4, connected to component 3 through tracks 61, 62 and connection lead 60.

To provide the connection of plane 41 for example to track 62, in the variant of FIG. 5a a connecting pin 70 is provided disposed in a metallized hole 71, itself formed in device 4. The conducting plane 41 is in electrical contact with the metallized hole 71. The connecting pin 70 is integral with base 1 (disks 73) and is soldered to the upper face of device 4 (solder 72). The sealing ring 6, in this embodiment, is placed inside the case with respect to pin 70.

The conducting plane 42 is connected to another metallized hole not shown in the Figure.

FIG. 5b shows another variant for connecting the distribution device 4 to base 1.

With respect to FIG. 5a, we find the following differences:

the connection pin 70, integral with base 1, is covered with a conducting cap 75 itself previously soldered or brazed at 76 to device 4;

the connecting plane 41 is connected at 77 to the soldered portion 76;

the electrical contact between plane 41 and pin 70 no longer made through the walls of holes 71, which therefore no longer needs to be metallized, but by crimping, at 79, cap 75 to pin 70;

the sealing ring 6 is now situated outside the case with respect to the connection pin 70.

The variant shown in FIG. 5b has more especially the advantage of reducing to a maximum the length of the connections between the elements 3 and 4, which allows the inductance and consequently the impedance of these connections to be reduced. As is known, that is particularly desirable in the case of circuits with low potentials and low response times.

FIG. 5c shows another variant for connecting the distribution device 4, in which this latter is placed on the upper face of the last but one stage of base 1, through the sealing ring 6. The electrical connection is provided by means of a metal bridge 78, sealed or brazed (76) on the one hand to the upper face of device 4 and on the other to the upper face of base 1, in alignment with connections 62. As shown in FIG. 5b, the connection planes 41 (for example) are connected to the metal bridge by means of elements 71 and 76.

In the different variants shown in FIG. 5, no decoupling capacitor such as 5 has been shown for the sake of clarity of the drawing but they may of course be added in accordance with one of the above described variants.

By way of example, a distribution device of the invention was constructed in accordance with the numerical example given above, with the following dimensions: length and width=24 mm, thickness of the order of 0.1 to 1 mm for three conducting planes, the thickness of the conducting planes being of the order of 10 microns or so.

The above description was given by way of non limitative example. Thus, more especially, components 5 have been described as discrete capacitors intended for decoupling, but they may be formed by any component discrete or integrated, required by the application.

What is claimed is:

1. A chip carrier comprising:
   (1) a base having
      (a) a recessed central portion adapted to receive an electronic component with contact pads which require electrical connections from said pads to outside the carrier,
      (b) a first plurality of pads mounted on a periphery of the recessed central portion to make electrical contact with the contact pads of the components,
      (c) a second plurality of pads on a surface of said base,
      (d) a plurality of electrically conductive paths connecting respectively said first and second plurality of pads to each other,
   (2) a flat cover covering said recess, being mountable on said base and having two parallel principal faces comprising,
      (a) a first plurality of pads electrically connectable to said second plurality of pads on said base,
      (b) a plurality of connections to a second plurality of contact pads on an outer surface of said carrier,
      (c) a plurality of electrically conductive sheets within said cover positioned one above the other and insulated one from the other, and substantially flat and parallel to the principal face of the cover,
      (d) each of said sheets being connected to more than one of and different ones of said first pads of said cover and being connected to one of said plurality of connections.

2. A chip carrier according to claim 1, wherein the conductor has a substantially solid rectangular shape.

3. A chip carrier according to claim 1 further comprising means for applying two different external power signals to two of said sheets, respectively, each through different ones of said second plurality of contact pads to which said sheet is connected, and wherein more than one of said first pads on said cover to which said sheets are connected are located along opposite edges of each of said sheets, whereby when an electrical reference signal is applied by said applying means, said signal is transmitted across said sheet and then to opposite edges of said base through said second plurality of pads on said base, and to pads of the first plurality of pads on the base located at opposite edges of the recess, and are adapted to be connected to contact pads on the component when mounted in the recess and which contact pads are remote from each other.

4. A chip carrier according to claim 3 wherein the conductive sheets have a substantially solid rectangular shape, and each of said conductive sheets has said connections to said first conductive pads on three different edges of said sheet.

5. A chip carrier according to claim 1 further comprising means for sealing said base and said cover one to another to enclose said recess.

6. A chip carrier according to claim 1, further comprising an external cover sealed to the base with the flat cover housed between the base and the external cover.

7. A chip carrier according to claim 1 wherein the number of said first plurality of pads on said base exceeds total number of outside contacts on said carrier by at least 5:4.

8. A chip carrier according to claim 3 wherein said number of first plurality of pads on said bases is approximately 250 and said total number of said contacts on said carrier is approximately 196.

9. A casing for housing an electronic component, comprising a device (4) adapted to distribute electric potentials, and a base plate (1) carrying said component, the device is fixed to the base plate and includes at least two conducting layers (41, 42) insulated (40) from one another and connected to external electric potentials, one being a potential of reference and the other a feed potential for the component (3), the device and the base plate being provided with electric interconnection means, the base plate being provided with connections to external connections for connecting the casing to external electric potentials,, and with a plurality of internal connections for connecting the base plate with the component, each of the conducting layers being connected via said interconnection means to at least one external connection and to a plurality of internal connections.

10. A casing according to claim 9, wherein the device (4) is fixed onto the base plate (1) above a zone wherein the component (3) is intended to be fixed, so as to constitute a cap of the casing for the component, the casing being further formed by the base plate.

11. A casing according to claim 9 wherein the device is placed on the base plate (1) above the zone wherein the component (3) is intended to be fixed, and is covered by a cap (2) fixed onto the base plate, the cap and base plate forming the casing for the component.

12. A casing according to any claim 10 or 11 wherein the device further comprises at least one decoupling capacitor (5) connected between the reference potential of the device and the conducting layer.

13. A casing according to claim 12, wherein the capacitor (5) is placed on one of the faces of the device, face or opposite to the zone of the base plate wherein the component (3) is intended to be fixed.

14. A casing according to claim 12, wherein the capacitor is placed in a recess (45) made into one of the faces of the device (4), such that the capacitor does not project from said face.

15. A casing according to claim 10, wherein the interconnection means are of three types, the first type of means (61, 65, 65) ensuring the direct electric connection between the component (3) and the exterior and allowing to transmit the information signals, the second type of means (63, 64, 65) ensuring the direct electric connection between the distribution device and the exterior and allowing to transfer to the device the electric potentials to be distributed, and the third type of means (61, 62) ensuring inside the casing the electric connection between the distributor device (4) and the component (3) and allowing to transfer the external potentials to said component.

16. A carrier according to claim 1 wherein each of said sheets is connected to a different one of said plurality of connections.

17. A casing according to claim 9 wherein each of the conducting layers is connected by said interconnection means to a different external connection.

* * * * *